(12) United States Patent
Kawai et al.

(10) Patent No.: US 8,797,742 B2
(45) Date of Patent: Aug. 5, 2014

(54) ELECTRONIC CONTROLLER FOR VEHICLE

(75) Inventors: Yoshio Kawai, Isesaki (JP); Eiji Ichikawa, Isesaki (JP); Takayuki Fukuzawa, Isesaki (JP)

(73) Assignee: Hitachi Automotive Systems, Ltd., Ibaraki (JP)

(*) Notice: Subject to any disclaimer, the term of this patent is extended or adjusted under 35 U.S.C. 154(b) by 484 days.

(21) Appl. No.: 13/043,684

(22) Filed: Mar. 9, 2011

(65) Prior Publication Data

US 2011/0228498 A1    Sep. 22, 2011

(30) Foreign Application Priority Data

Mar. 17, 2010 (JP) ................. 2010-060075
Mar. 19, 2010 (JP) ................. 2010-063769
Mar. 23, 2010 (JP) ................. 2010-065508

(51) Int. Cl.
 *H05K 7/20* (2006.01)
(52) U.S. Cl.
 USPC ............ 361/707; 361/704; 361/705; 361/710
(58) Field of Classification Search
 USPC ................ 361/676–678, 679.46–679.54, 361/688–720, 752, 760, 831
 See application file for complete search history.

(56) References Cited

U.S. PATENT DOCUMENTS

| | | | |
|---|---|---|---|
| 6,282,092 B1 | 8/2001 | Okamoto et al. | |
| 6,365,964 B1* | 4/2002 | Koors et al. | 257/718 |
| 7,031,165 B2* | 4/2006 | Itabashi et al. | 361/719 |
| 7,440,282 B2* | 10/2008 | Brandenburg et al. | 361/704 |
| 8,081,463 B2* | 12/2011 | Chiu-Mao et al. | 361/702 |
| 8,373,990 B2* | 2/2013 | Jarmany | 361/707 |
| 8,379,390 B2* | 2/2013 | Inoue | 361/713 |
| 2003/0227750 A1* | 12/2003 | Glovatsky et al. | 361/699 |
| 2008/0278918 A1* | 11/2008 | Tominaga et al. | 361/719 |

FOREIGN PATENT DOCUMENTS

| | | |
|---|---|---|
| JP | 03-013786 | 1/1991 |
| JP | 3-13786 | 2/1991 |
| JP | 09-226280 | 9/1997 |
| JP | 10-135672 | 5/1998 |
| JP | 11-266089 | 9/1999 |
| JP | 11-354956 | 12/1999 |
| JP | 2000-174468 | 6/2000 |

(Continued)

OTHER PUBLICATIONS

Japan Patent Office Communication mailed Jun. 19, 2012, in Appln. No. 2010-065508.
Japan Patent Office Communication mailed Jun. 19, 2012, in Appln. No. 2010-060075.

(Continued)

*Primary Examiner* — Courtney Smith
(74) *Attorney, Agent, or Firm* — Antonelli, Terry, Stout & Kraus, LLP.

(57) ABSTRACT

An electronic controller for a vehicle includes a circuit board on which an electronic component is mounted and a metal housing accommodating the circuit board therein. The housing includes an inner face and an outer face, at least one of the inner face and the outer face being subjected to surface treatment facilitating heat absorption and dissipation. The inner face of the housing further includes a protruding portion extending to a heating portion of the circuit board so as to be close to the heating portion, or includes concavities and convexities at at least a part thereof opposed to a surface of the circuit board on which the electronic component is mounted so as to increase a surface area of the inner face.

17 Claims, 18 Drawing Sheets

(56) References Cited

FOREIGN PATENT DOCUMENTS

| | | |
|---|---|---|
| JP | 2004-304200 | 10/2004 |
| JP | 2006-108398 | 4/2006 |
| JP | 2006-313768 | 11/2006 |
| JP | 2007-059608 | 3/2007 |
| JP | 2009-099753 | 5/2009 |
| JP | 2009-158796 | 7/2009 |
| JP | 2009-164568 | 7/2009 |
| JP | 2010-010220 | 1/2010 |

OTHER PUBLICATIONS

Japan Patent Office Communication mailed Jun. 19, 2012, in Appln. No. 2010-063769.

JP Office Action for Japanese Application No. 2010-060075, issued on Mar. 19, 2013.

JP Office Action for Japanese Application No. 2010-063769, issued on Mar. 19, 2013.

JP Office Action for Japanese Patent Application No. 2010-063769, issued on Dec. 17, 2013.

* cited by examiner

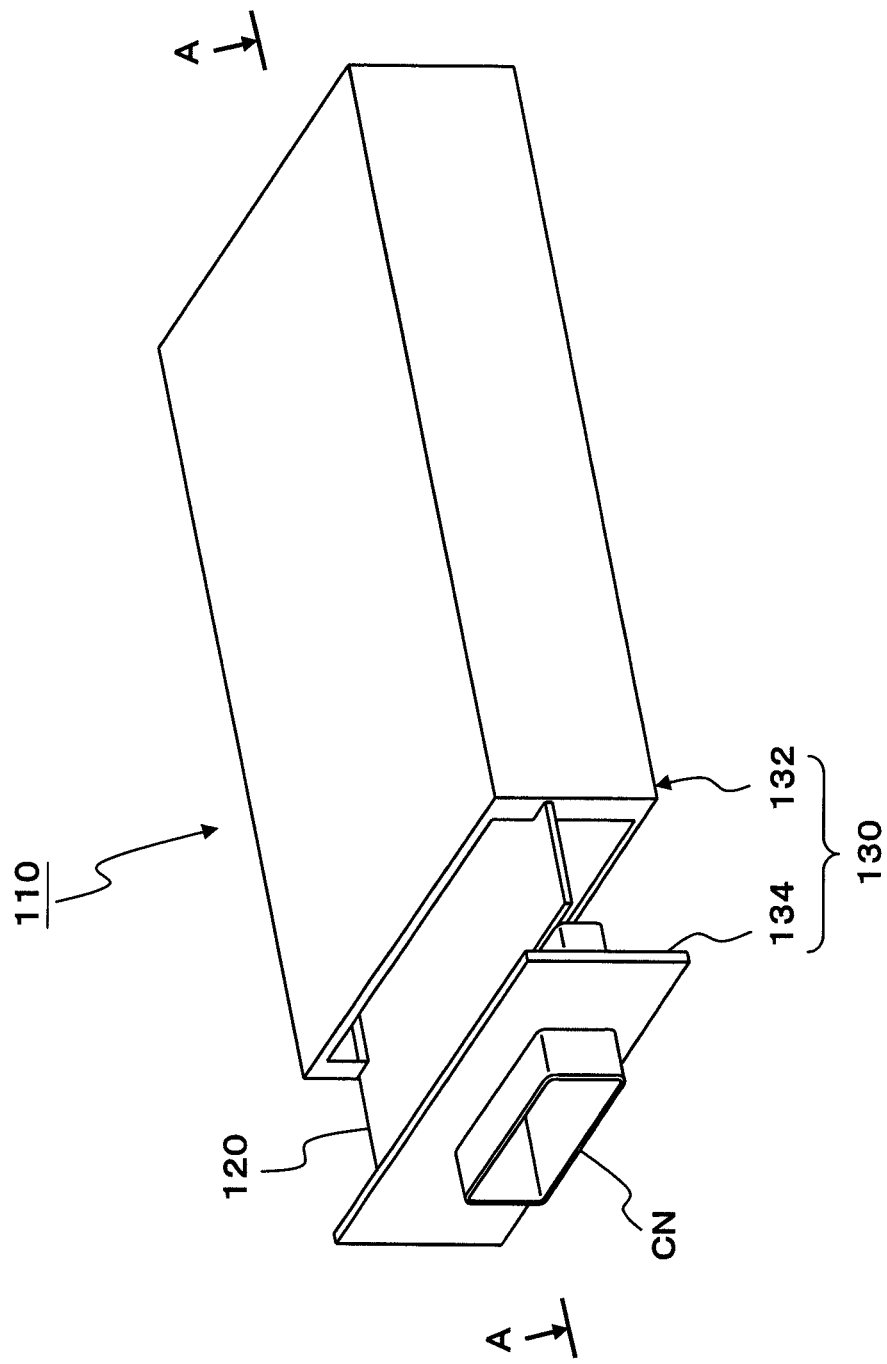

US 8,797,742 B2

ELECTRONIC CONTROLLER FOR VEHICLE

BACKGROUND OF THE INVENTION

1. Field of the Invention

The present invention relates to an electronic controller mounted in a vehicle.

2. Description of Related Art

An electronic controller mounted in a vehicle includes a housing made of metal and a circuit board accommodated in the housing. Since the circuit board includes a heater element mounted thereon such as a semiconductor switching element, the circuit board has a heat dissipation structure so that heat generated at the heater element is transferred to the housing and is dissipated from the outer face of the housing to the air. For preferable heat transfer from the heater element to the housing and such heat dissipation from the housing to the air, a technique of surface treatment to the housing surface has been proposed.

In a conventional electronic controller, however, the surface treatment is conducted at the housing surface so as to absorb heat radiated from the heater element. In such a configuration, the heater element away from the housing surface or a small surface area of the housing relative to the heater element may lead to insufficient heat transfer from the heater element to the housing.

SUMMARY OF THE INVENTION

According to the present invention, an electronic controller for vehicle includes a circuit board with an electronic component mounted thereon and a metal housing accommodating the circuit board therein. The housing includes an inner face and an outer face, at least one of the inner face and the outer face being subjected to surface treatment facilitating heat absorption and dissipation. The inner face of the housing further includes a protruding portion extending to a heating portion of the circuit board so as to be close to the heating portion, or includes concavities and convexities in at least a part of the inner surface of the housing which is opposed to a surface of the circuit board on which the electronic component is mounted so as to increase a surface area of the inner face.

Other objects and features of the present invention will be understood from the following description with reference to the accompanying drawings.

BRIEF DESCRIPTION OF DRAWINGS

FIG. 14 is a perspective view illustrating an example of an electronic controller for a vehicle in a second embodiment;

DESCRIPTION OF THE PREFERRED EMBODIMENT

Figure 1:
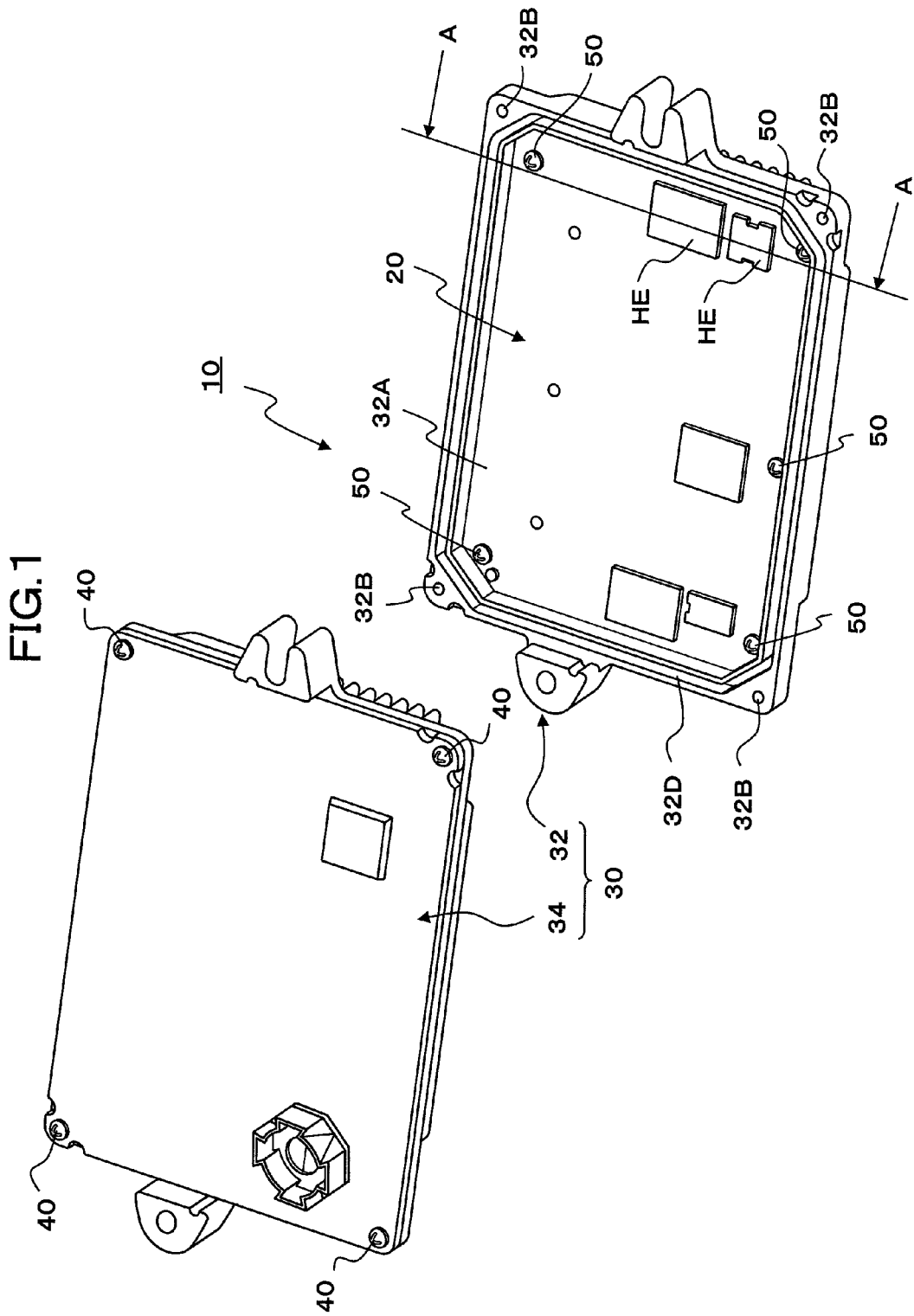
FIG. 1 is a perspective view illustrating an example of an electronic controller for vehicle in a first embodiment.

FIG. 1 illustrates an example of an electronic controller for a vehicle (hereinafter called an electronic controller) in a first embodiment.

Electronic controller 10 includes: a circuit board 20 with a surface on which a heater element HE as an electronic component is mounted at least; and a housing 30 accommodating circuit board 20 therein. Housing 30 includes: a main body 32 having a recessed portion 32A to accommodate the circuit board 20 therein; and a lid 34 to close an opening of main body 32. Main body 32 and lid 34 are made of alloys containing aluminum (Al), magnesium (Mg), iron (Fe) and the like as main components, which are manufactured by casting using a die, pressing, cutting or the like.

Figure 2:
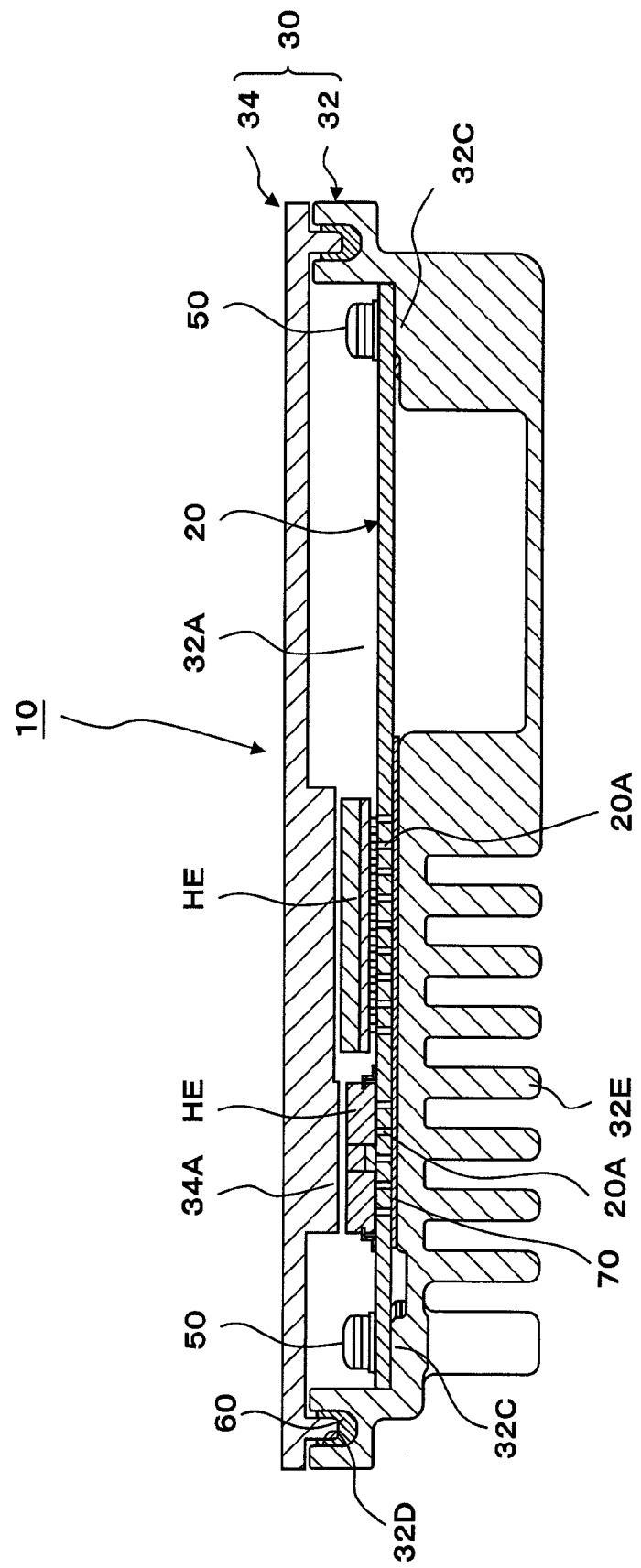
FIG. 2 is an exemplary cross-sectional view taken along the line A-A in FIG. 1.

Main body 32 has a substantially rectangular contour with rounded corners in a plan view, in which recessed portion 32A is formed to accommodate circuit board 20 therein from one face toward the other face located on the opposite side. Each of the four corners of main body 32 has a female thread 32B to fasten lid 34 by using a screw 40 as an example of fastening member. As illustrated in FIG. 2, recessed portion 32A of main body 32 includes a plurality of bosses (pedestals) 32C vertically arranged with a female thread being formed at a end thereof so as to support and fix circuit board 20 by using screws 50 as an example fastening member. Around recessed portion 32A of main body 32, a surrounding groove 32D is formed, into which an elastic member 60 such as an O-ring, silicone or an adhesive is fitted or applied for the purpose of securing a seal with lid 34. Lid 34 has a substantially rectangular contour with rounded corners in a plan view with holes bored at four corners thereof, into each of which a screw 40 is penetrated.

As illustrated in FIG. 2, circuit board 20 includes thermal vias 20A bored in a portion at which the heater element HE is mounted, the portion being in contact with the bottom face of recessed portion 32A of main body 32 with a heat-conductive adhesive 70 intervening therebetween. An outer face of main body 32 in contact with the heater element HE includes a well-known heat-dissipating fin 32E disposed in a line to dissipate heat transmitted from the heater element HE to main body 32 to the air. Instead of adhesive 70, heat-conductive grease, a heat-dissipating sheet or the like may be used.

At least one of the inner face and the outer face of main body 32 and lid 34 is subjected to surface treatment to facilitate absorption of heat radiated from the heater element HE and heat dissipation from housing 30. As one example of the surface treatment, application or electro-deposition of an insulating material, alumite treatment or the like is available to easily implement the surface treatment that facilitates the absorption and dissipation of heat (the same will be applied hereunder).

As illustrated in FIG. 2, in order to facilitate absorption of heat radiated from the heater element HE, the inner face of lid 34 includes a protruding portion 34A extending toward the heater element HE of circuit board 20 so as to be close to the heater element HE. In the example illustrated in FIG. 2, two heater elements HE are mounted close to each other, so that two protruding portions 34A are formed integrally. However, two protruding portions 34A may be separated clearly. Here, if the end of protruding portion 34A comes in contact with the heater element HE, stress will act on circuit board 20 due to vibration or the like. Therefore, clearance is to be secured so as to prevent the end of protruding portion 34A from being in contact with the heater element HE with consideration given to the dimensions of housing 30 or the like. Heat-conductive grease or the like may intervene between the heater element HE and protruding portion 34A of lid 34.

According to such an electronic controller 10, heat generated at the heater element HE of circuit board 20 is transmitted to housing 30 via the following two paths, and dissipated to the air from the outer face of housing 30. That is, heat generated at the heater element HE is transmitted to the main body 32 via thermal vias 20A the adhesive 70. Furthermore, heat generated at the heater element HE is transmitted to lid 34 via protruding portion 34A. At this time, the end of protruding portion 34A is close to the heater element HE, thus facilitating the absorption of heat radiated from the heater element HE, so that heat generated at the heater element HE can be effectively transmitted to lid 34. Heat transmitted to main body 32 and lid 34 is dissipated to the air through heat-dissipating fin 32E and the outer face. Herein, the surface treatment conducted to the inner face of lid 34 including protruding portion 34A can facilitate the absorption of heat generated at the heater element HE. Whereas, the surface treatment conducted to the outer faces of main body 32 and lid 34 can enhance the heat-dissipation effect from the outer faces to the air. Thus, the heat-dissipating property of the electronic controller 10 can be improved.

From an aspect of heat transfer, minimum clearance between protruding portion 34A and heater element HE is the most advantageous as long as the end of protruding portion 34A is not in contact with the heater element HE or the vicinity thereof. Accordingly, protruding portion 34A is preferably formed in the vicinity of a joint part of main body 32 and lid 34 or in the vicinity of a boss 32C fixing circuit board 20 to main body 32. Thus, protruding portion 34A is located at a portion of high fixation stiffness of circuit board 20 relative to main body 32, and therefore, even when circuit board 20 or housing 30 is deformed to some extent due to, for example, vibration or external stress, the heater element HE and the vicinity thereof can be prevented from being in contact with the end of protruding portion 34A. In the case in which there is a difficulty in forming protruding portion 34A at the joint part or in the vicinity of boss 32C, protruding portion 34A may be formed at a position on a line segment between two bosses 32C, the position can be considered of the second highest fixation stiffness of the circuit board 20. Needless to say, the heater element HE of circuit board 20 is to be mounted at a position opposed to protruding portion 34A.

Figure 3:
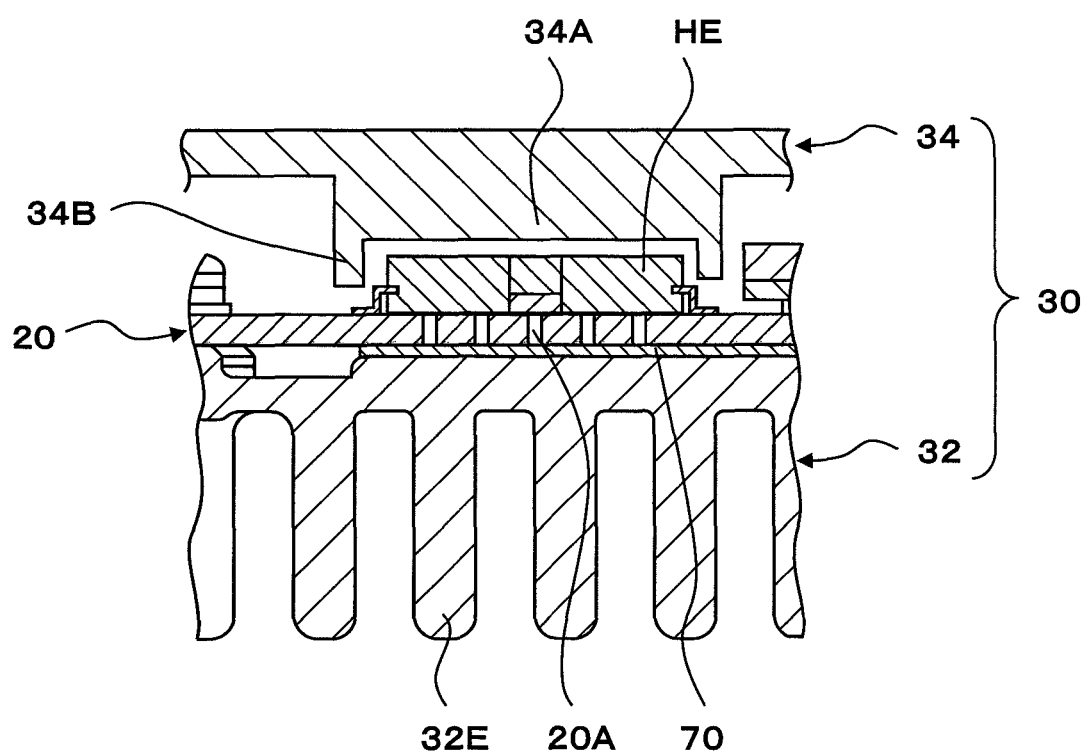
FIG. 3 is a partial cross-sectional view illustrating a first modification example of a protruding portion.

For preferable heat transfer from the heater element HE to protruding portion 34A, as illustrated in FIG. 3, an extending portion 34B extending toward the heater element HE may be integral with protruding portion 34A so as to cover side walls of the heater element HE. Thus, heat generated at the heater element HE can be transmitted to extending portion 34B as well, further facilitating heat transfer to housing 30. In this case, extending portion 34B may cover at least a part of side walls of the heater element HE, for instance, when the heater element HE has a substantially rectangular parallelepiped shape, extending portion 34B may cover at least one of the four side walls of the heater element HE.

Figure 4:
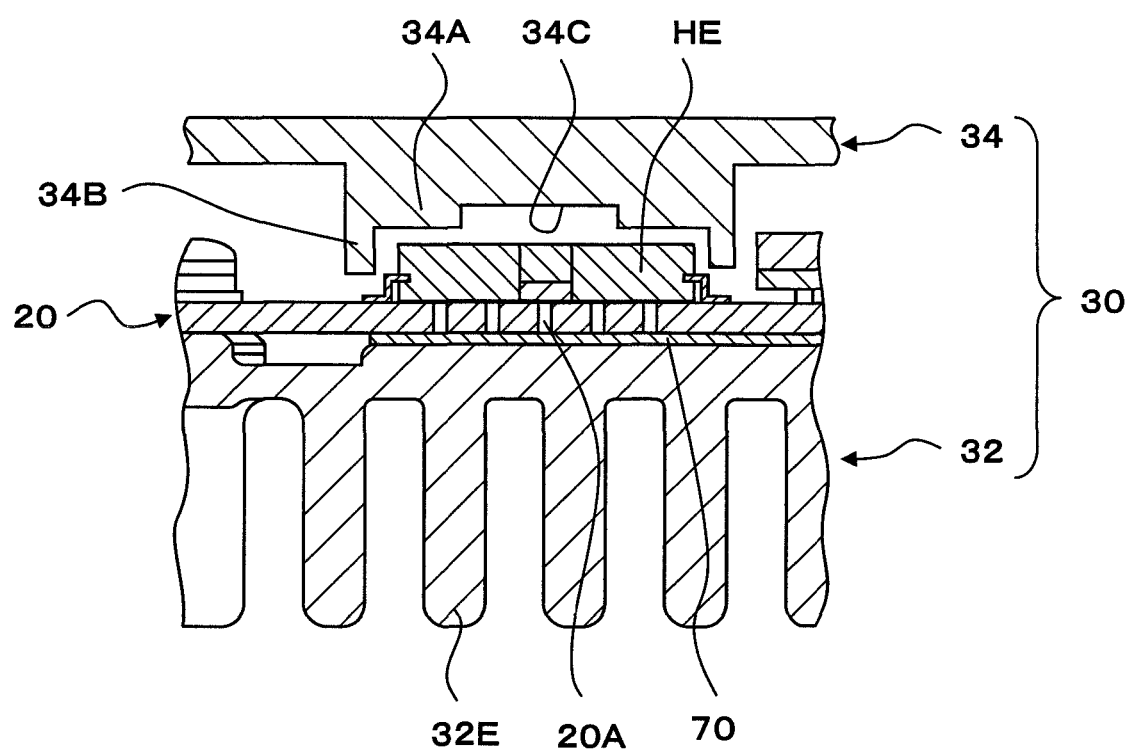
FIG. 4 is a partial cross-sectional view illustrating a second modification example of a protruding portion.

In the case in which main body 32 and lid 34 are manufactured by casting using a die, main body 32 or lid 34 suffer from an impression pressed by an eject pin for die-releasing of main body 32 or lid 34 from the die. Such an impression by the eject pin causes a portion in contact with the pin to cave on the surface of main body 32 or lid 34, while causing its surrounding portion to rise, thus making it difficult to obtain small clearance between protruding portion 34A and the heater element HE. Therefore, such an impression by an eject pin at the end of protruding portion 34A is not preferable. Thus, when using a die that makes an eject pin press protruding portion 34A, as illustrated in FIG. 4, a recessed portion 34C is preferably formed at the end of protruding portion 34A so as to accommodate the impression by the eject pin therein. The depth of recessed portion 34C may be greater than the height of the portion rising due to contact with the eject pin and the diameter of recessed portion 34C may be slightly greater than the diameter of the eject pin to secure the heat-transfer performance from the heater element HE to protruding portion 34A. In the example of FIG. 4, extending portion 34B is integral with the end of protruding portion 34A; however, extending portion 34B is optionally formed.

Figure 5:
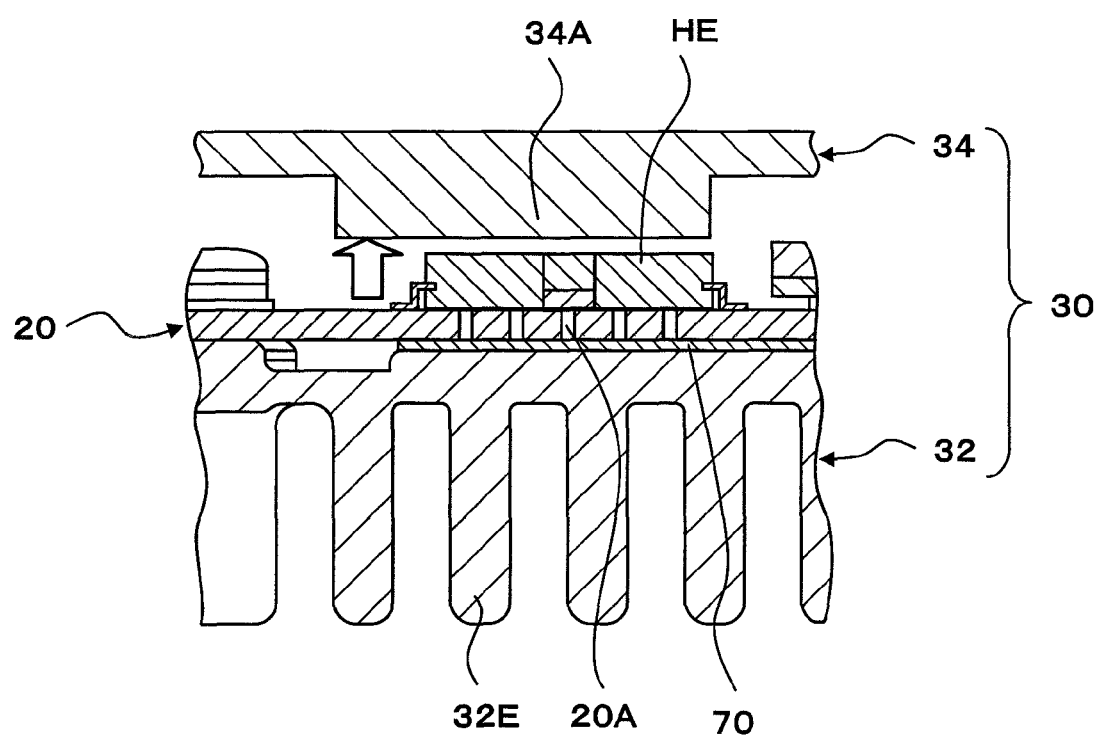
FIG. 5 is a partial cross-sectional view illustrating a third modification example of a protruding portion.

In the case of circuit board 20 with two heater elements HE not close to each other, as illustrated in FIG. 5, protruding portion 34A may be formed beyond the range opposed to the heater element HE so as to allow an eject pin press a portion not opposed to the heater element HE.

Figure 6:
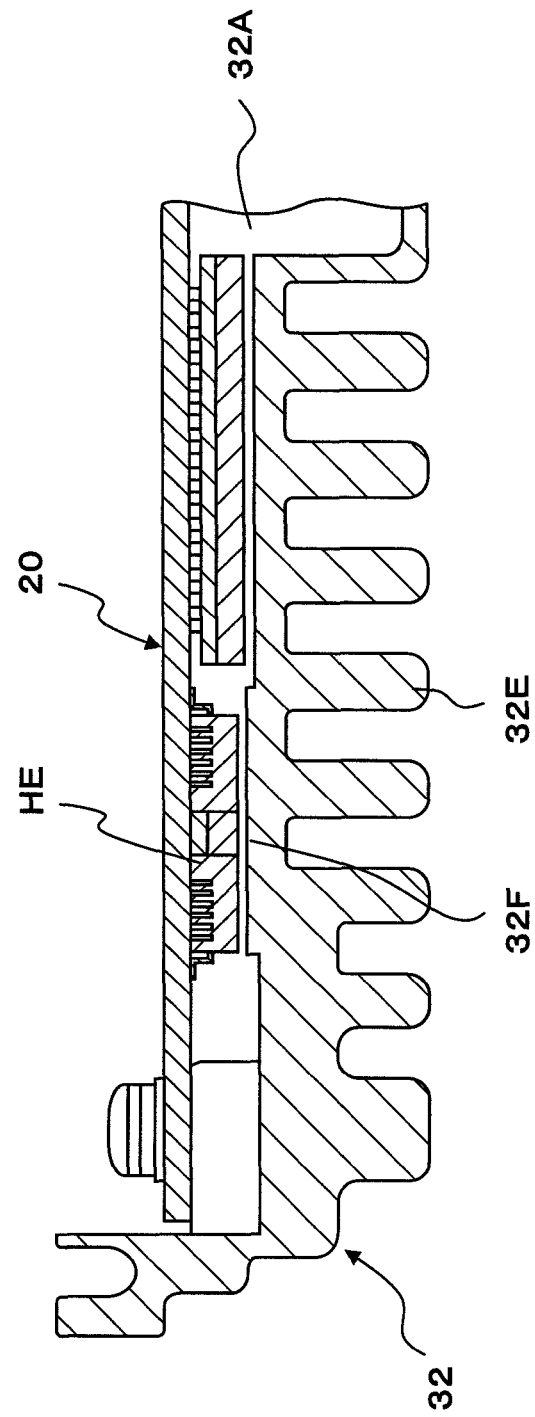
FIG. 6 is a partial cross-sectional view illustrating another assembling method of a heater element.

As illustrated in FIG. 6, the heater element HE may be attached to the rear face of circuit board 20 so as to be opposed to the bottom face of recessed portion 32A of main body 32. In this case, a protruding portion 32F extending toward the heater element HE is formed in recessed portion 32A of main body 32. This configuration can reduce the amount of heat dissipated from the surface of circuit board 20 because of heat dissipation to protruding portion 32F, so that the surface of circuit board 20, which is conventionally used exclusively for heat dissipation with thermal vias disposed therein, is not used for the heat dissipation of the heater element HE. Instead, other electronic components (including a heater element) can be mounted thereon, thus leading to miniaturization of electronic controller 10. In this case, since a positive function of lid 34 for heat transfer and heat dissipation can be lessened, lid 34 may be made of a material with less heat conductivity, for example resin, or the opening of main body 32 may be filled with resin or the like to close the opening of main body 32 without using lid 34.

Figure 7:
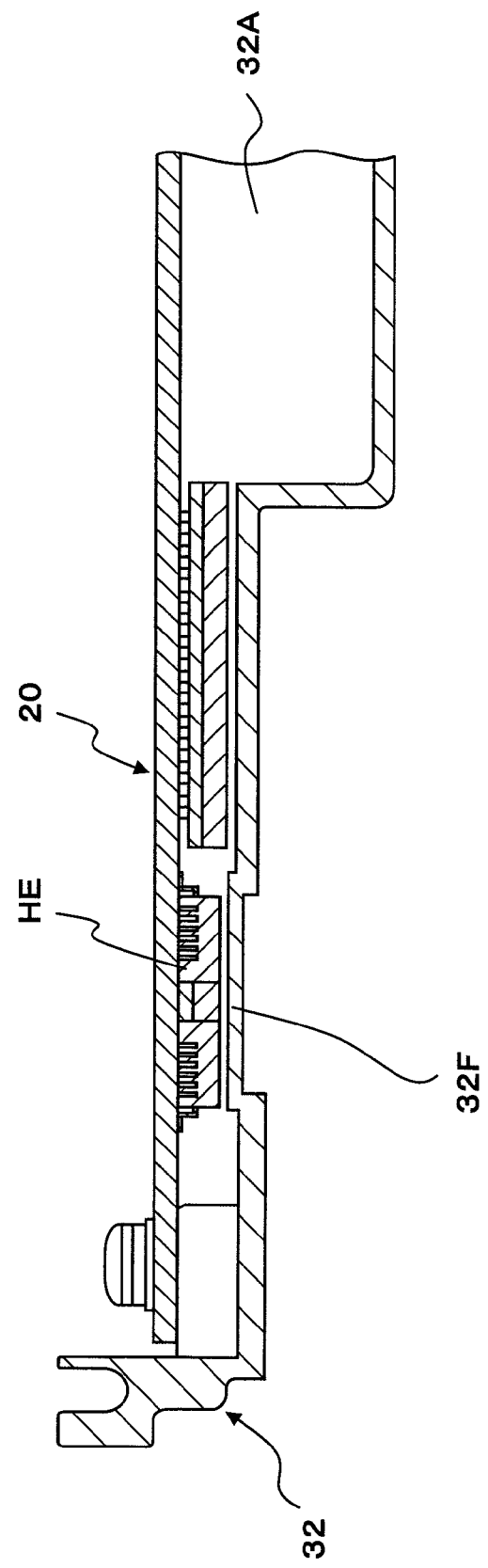
FIG. 7 is a partial cross-sectional view illustrating a modification example of a main body.

It should be noted that protruding portion 32F or 34A may be formed not only at a portion opposed to the heater element HE but also at the heater element HE, a pattern on the board, solder, and a portion including the periphery of them, by which the temperature of circuit board 20 effectively can be decreased. The outer face of main body 32 or lid 34 opposite the protruding portion 32F or 34A may be formed in a flat shape, a recess shape (see FIG. 7), a fin shape, or a shape with fins disposed in a line in a recessed portion so as to allow heat transmitted to housing 30 dissipate to the air. At this time, a fin shape or a shape with fins disposed in a line in a recessed portion on the outer face of housing 30 can increase the surface area for heat dissipation.

The configurations illustrated in the drawings may be combined as needed (the same will applied hereunder).

Figure 8:
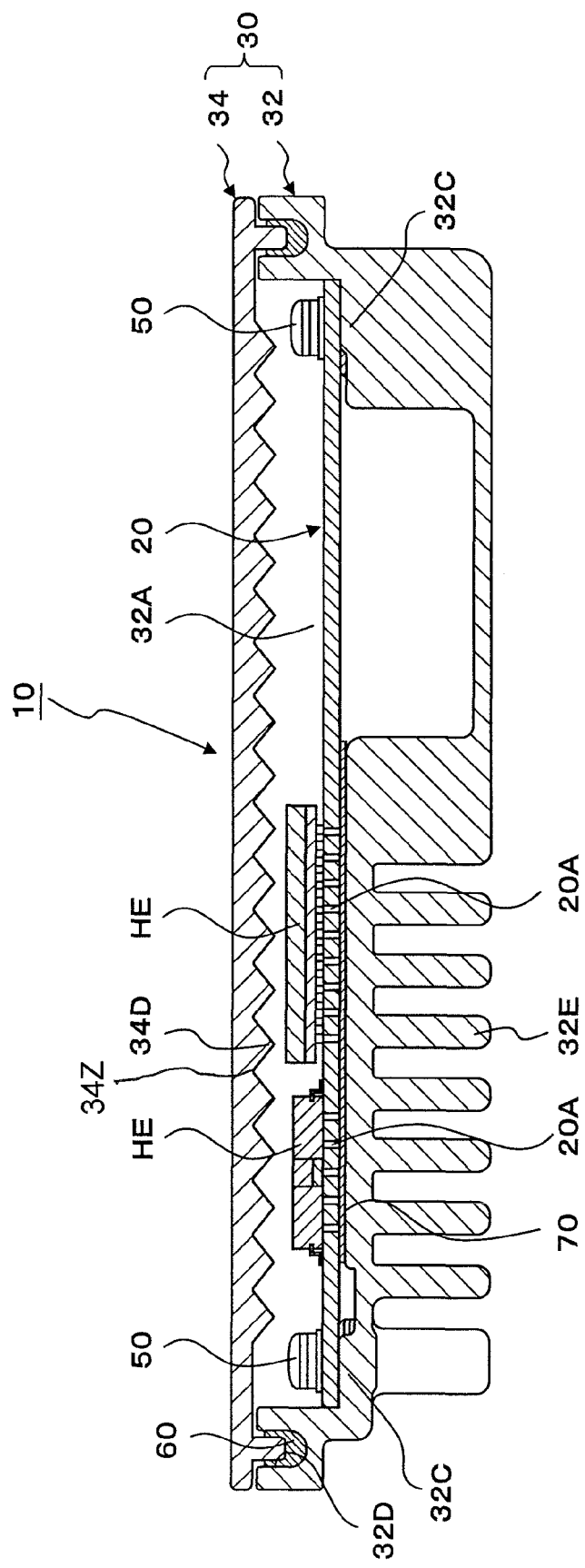
FIG. 8 is another example of a cross-sectional view taken along the line A-A of FIG. 1.

Instead of protruding portion 32F or 34A, as illustrated in FIG. 8, the inner face of lid 34 may be formed with continuous concavities 34Z and convexities 34D of a substantially same shape from one end to the other end to increase the surface area so as to facilitate the absorption of heat generated at circuit board 20 including the heater element HE. Concavities 34Z and convexities 34D may have a height such that the end thereof is not in contact with circuit board 20 including the heater element HE.

As examples of concavities and convexities 34D, for example, a fin shape, a sine-wave shape, a rectangular-wave shape, a sawtooth-wave shape, a triangular-wave shape, a protrusion shape including a cone shape or a pearskin finish shape may be used to easily make concavities and convexities 34D with preferable heat absorption property (the same will applied hereunder). Concavities and convexities 34D may be formed at least at a portion opposed to the heater element HE.

Figure 9:
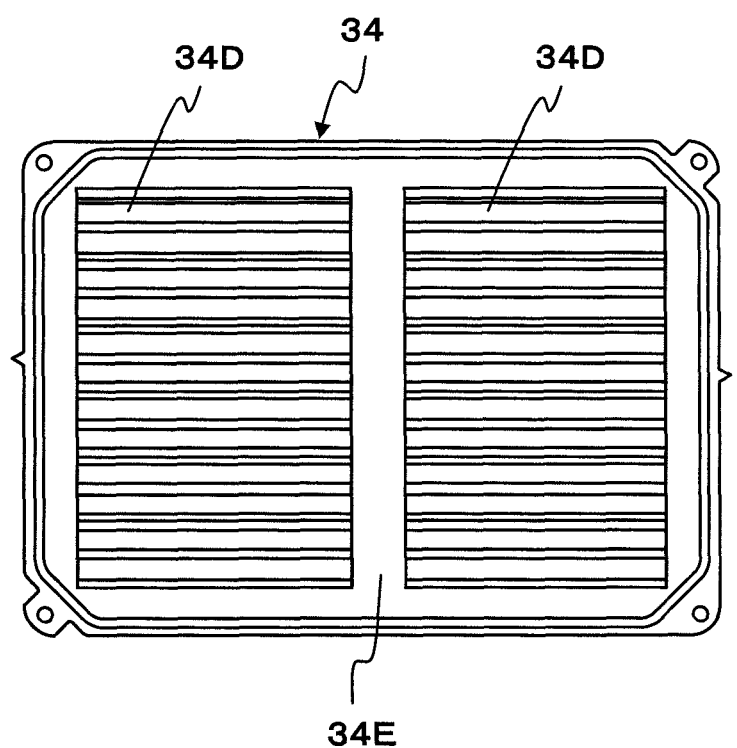
FIG. 9 is a plan view illustrating a first modification example of concavities and convexities.

Concavities and convexities 34D of lid 34 may be at a portion or in a shape capable of improving at least one of the melt flow during casting of lid 34 and the stiffness of lid 34. In order to improve the melt flow during casting, as illustrated in FIG. 9, the lid 34 may be provided with a flat part 34E without concavities and convexities 34D formed thereon, in which ribs may be formed to improve the stiffness, for example. The number of flat part 34E and the ribs may be appropriately determined with consideration given to the dimensions of lid 34, for example. For instance, in the case in which concavities and convexities 34D of lid 34 are formed in a wave form, the ribs may be provided orthogonal thereto so as to compensate for a change in the stiffness of lid 34 in the orthogonal directions due to the ribs.

According to such an electronic controller 10, heat generated at the heater element HE of circuit board 20 is transmitted to housing 30 via the following two paths, and dissipated to the air from the outer face of housing 30. That is, heat generated at the heater element HE is transmitted to main body 32 via thermal vias 20A and adhesive 70. Furthermore, heat generated at the heater element HE is transmitted to lid 34 via concavities and convexities 34D. At this time, the inner face of lid 34 is formed with concavities and convexities 34D to increase the surface area, thus facilitating the absorption of heat radiated from the heater element HE, so that the heat generated at the heater element HE can be effectively transmitted to lid 34. Then, heat transmitted to main body 32 and lid 34 is dissipated to the air from the heat-dissipating fin 32E and the outer faces of main body 32 and lid 34. Herein, the surface treatment conducted to the inner face of lid 34 including concavities and convexities 34D can facilitate the absorption of heat generated at the heater element HE. Whereas, the surface treatment conducted to the outer faces of main body 32 and lid 34 can enhance the heat-dissipation effect from the outer faces to the air. Thus, the heat-dissipating property of electronic controller 10 can be improved.

Alternation of at least one of the inner face and the outer face of main body 32 and lid 34 from a flat face to a polyhedral face or a curved face can suppress electromagnetic waves from passing therethrough, so that a negative effect of a malfunction of the device and the like due to electromagnetic waves can be lessened.

Figure 10:
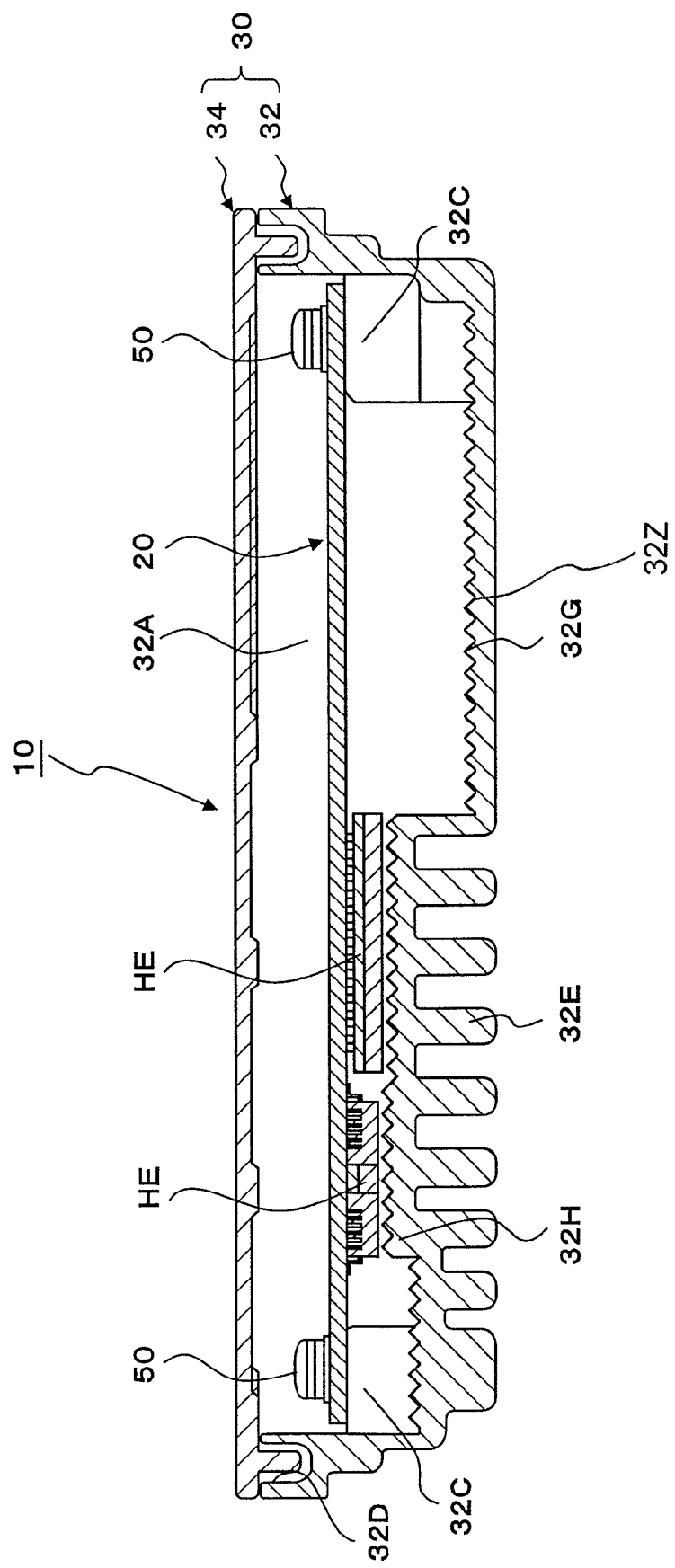
FIG. 10 is a cross-sectional view illustrating another assembling method of a heater element.

As illustrated in FIG. 10, the heater element HE may be attached to the rear face of circuit board 20 opposed to bottom face of recessed portion 32A of main body 32. In this case, the bottom face of recessed portion 32A is formed with continuous concavities 32Z and convexities 32G of substantially the same shape to increase the surface area. That is, concavities 32Z and convexities 32G are formed to increase the surface area at least at a part of the inner face of housing 30 opposed to the heater element HE-mounted face of circuit board 20.

Furthermore, in order to facilitate heat reception from the heater element HE, the bottom face of recessed portion 32A may be formed with a protruding portion 32H with concavities and convexities 32G at the end thereof, and protruding portion 32H extends toward the heater element HE of circuit board 20 so as to be close to the heater element HE (not in contact therewith). With this configuration, in addition to the effects and advantages of electronic controller 10 illustrated in FIG. 8, the amount of heat dissipated from the surface of the circuit board 20 can be reduced because of heat dissipation to concavities and convexities 32G, so that the surface of circuit board 20, which is conventionally used exclusively for heat dissipation with thermal vias disposed therein, is not used for the heat dissipation of the heater element HE. Instead, other electronic components (including a heater element) can be mounted, thus leading to miniaturization of electronic controller 10. In this case, since a positive function of lid 34 for heat transfer and heat dissipation can be lessened, lid 34 may be made of a material with less heat conductivity, for example resin, or the opening of main body 32 may be filled with resin or the like to close the opening of main body 32 without using lid 34.

The end of protruding portion 32H may be a flat face to decrease clearance with the heater element HE. In this case, heat-conductive grease may intervene between the end of protruding portion 32H and heater element HE.

Figure 11:
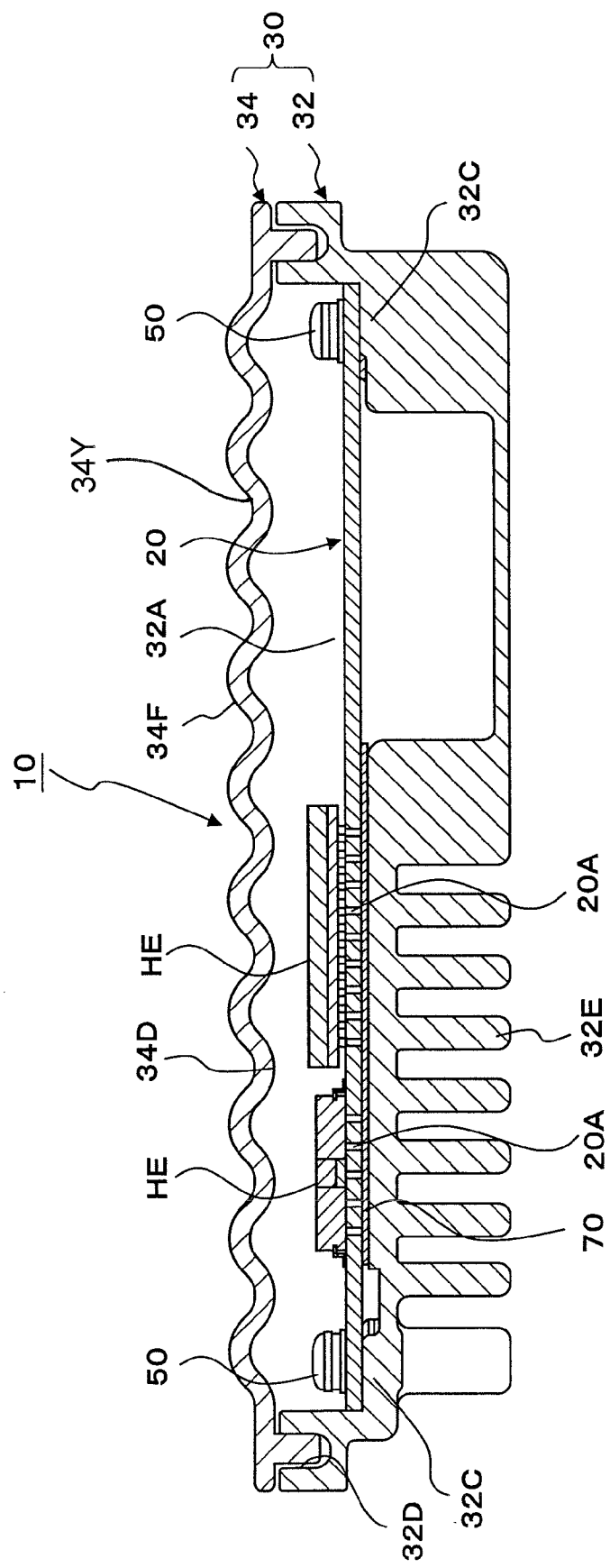
FIG. 11 is a cross-sectional view illustrating a second modification example of concavities and convexities.
Figure 12:
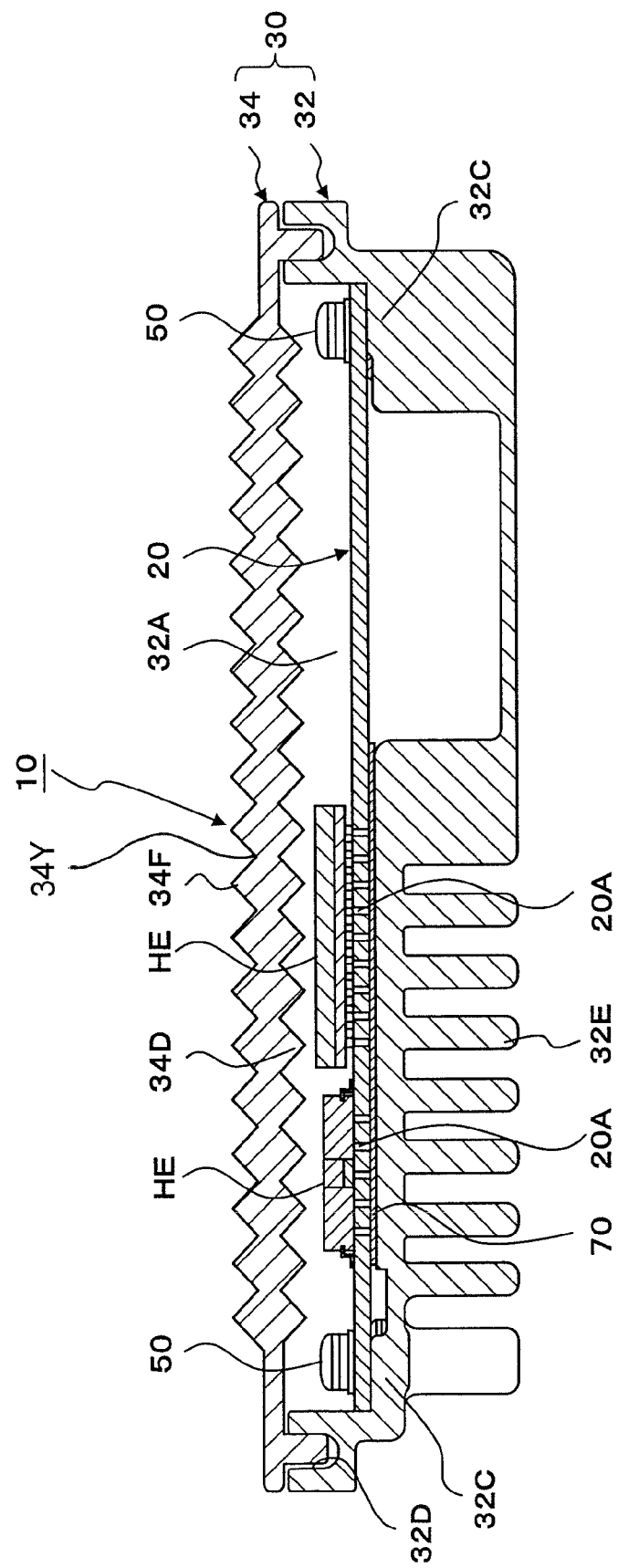
FIG. 12 is a cross-sectional view illustrating a third modification example of concavities and convexities.

The outer face of lid 34 that corresponds to the area with concavities 34Z and convexities 34D formed on the inner face of lid 34 may be further formed with continuous concavities 34Y and convexities 34F of substantially the same shape to increase the surface area. As illustrated in FIG. 11, concavities 34Y and convexities 34F formed on the outer face of lid 34 may be in a shape of the same phase according to concavities 34Z and convexities 34D on the inner face of lid 34, or, as illustrated in FIG. 12, may be in a shape symmetric about a line with reference to concavities 34Z and convexities 34D on the inner face of lid 34. In other words, concavities 34Y and convexities 34F formed on the outer face of lid 34 may be shaped corresponding to concavities 34Z and convexities 34D formed on the inner face thereof. Electronic controller 10 illustrated in FIG. 10 may be further formed with concavities and convexities on the outer face of main body 32.

Concavities and convexities 34F on the outer face of the same phase as concavities and convexities 34D on the inner face can make lid 34 thinner, so that the surface area for heat absorption can be secured, while obtaining preferable heat dissipation from the outer face. Concavities and convexities 34F on the outer face symmetric about a line with reference to the concavities and convexities 34D on the inner face can increase the heat capacity, so that the heat absorption performance can be improved.

Figure 13A:
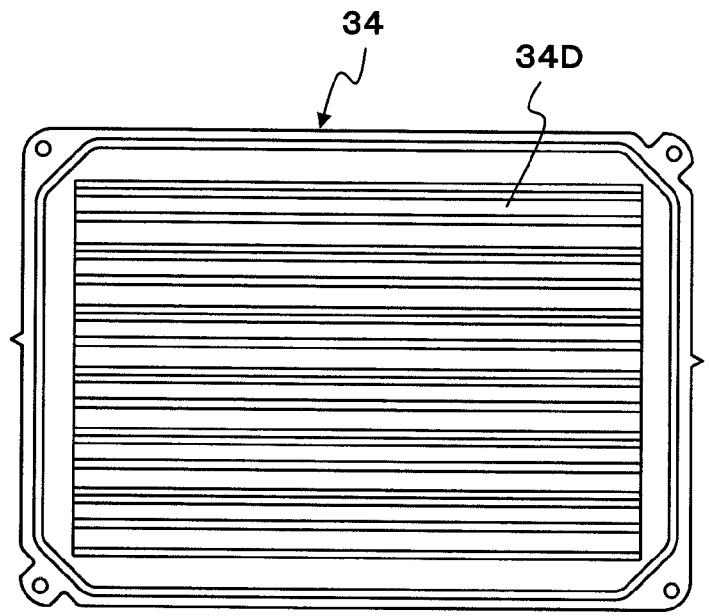
FIG. 13A is a plan view of a lid from the rear side illustrating a fourth modification example of concavities and convexities.
Figure 13B:
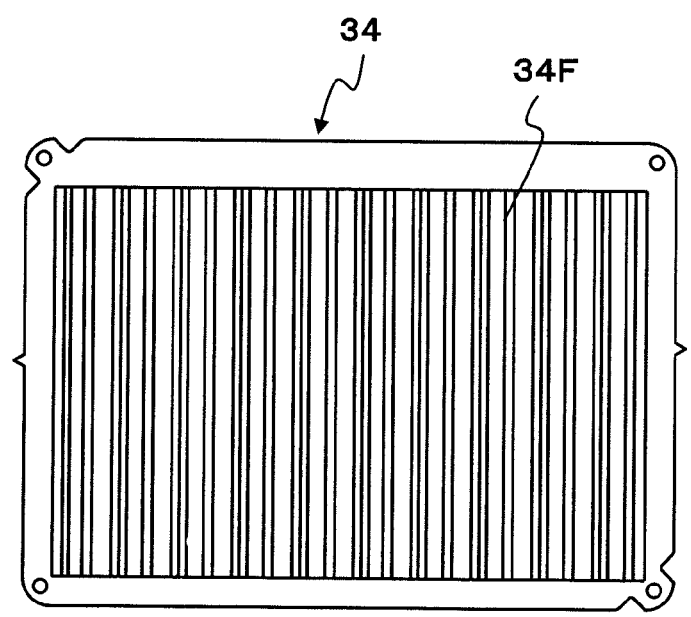
FIG. 13B is a plan view of a lid from the front side illustrating a fourth modification example of concavities and convexities.

As illustrated in FIGS. 13A and 13B, concavities and convexities 34D and concavities and convexities 34F formed on the inner face and the outer face of the lid 34, respectively, may be displaced 90 degrees in the formation directions. This configuration can increase the heat capacity of lid 34, while improving the stiffness thereof. The intersection angles of concavities and convexities 34D and concavities and convexities 34F are not limited to 90 degrees, but may be angles capable of increasing the stiffness.

FIG. 14 illustrates an example of electronic controller of a second embodiment.

An electronic controller 110 includes: a circuit board 120 with a heater element HE as an electronic component and a connector CN at least mounted thereon; and a housing 130 accommodating circuit board 120 therein. The housing 130 includes: a main body 132 of substantially a box shape that opens at one face only; and a lid 134 that closes the opening of main body 132. Lid 134 and circuit board 120 are integrated so as to let a connecting port of the connector CN appear on the outer face of lid 134. Herein, main body 132 and lid 134 are made of alloys containing aluminum (Al), magnesium (Mg), iron (Fe) and the like as main components, which are manufactured by casting using a die, pressing, cutting or the like.

Figure 15:
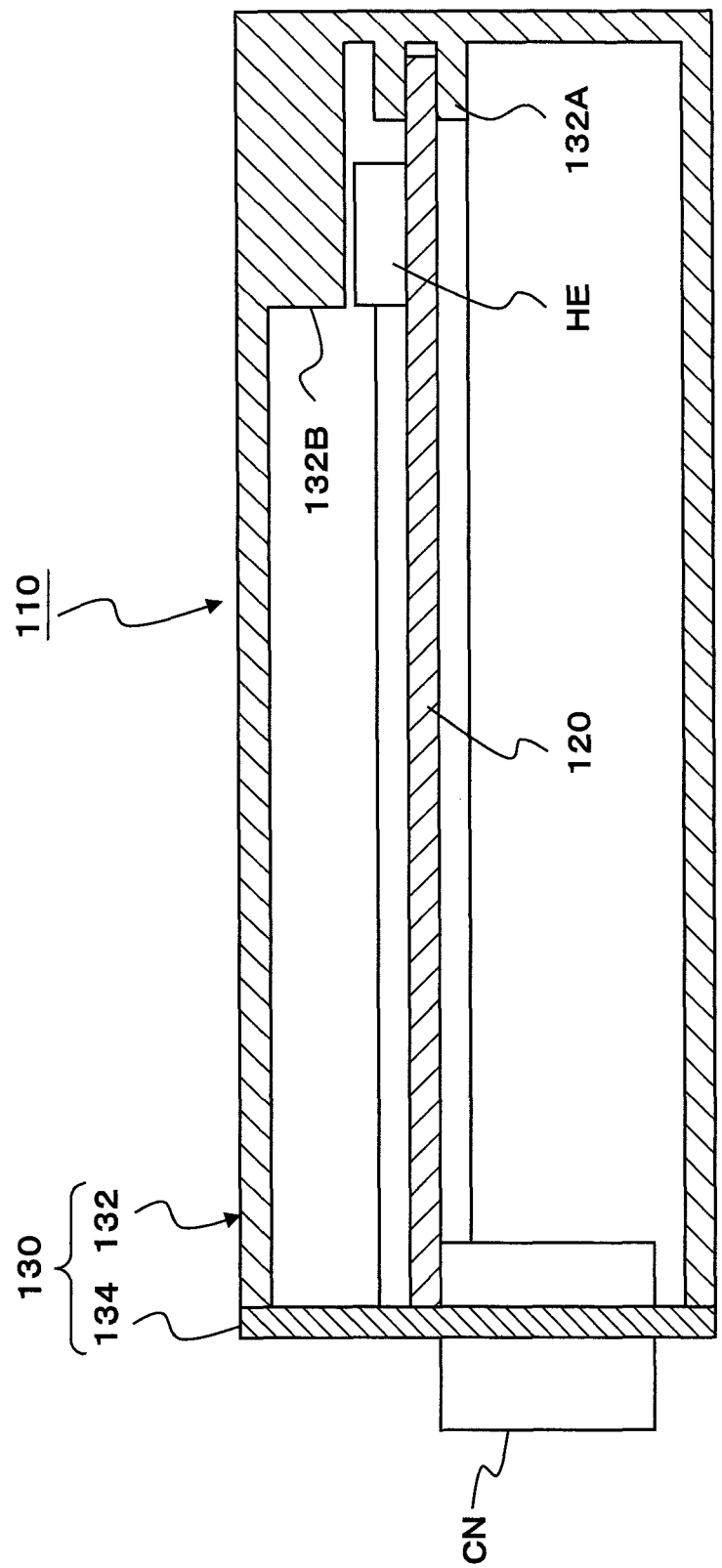
FIG. 15 is an example of a cross-sectional view taken along the line A-A in FIG. 14.

As illustrated in FIG. 15, the inner face of main body 132 is formed with a supporter 132A that protrudes from three side faces that are continuous from the opening to the deepest part and that is slidably fitted with the leading end and the left and right ends of circuit board 120. Supporter 132A is not limited to the shape protruding from the inner faces of main body 132 but may be a groove formed in the inner face of main body 132. Furthermore, main body 132 and lid 134 are formed with penetration holes and female threads with respect to which a fastening member such as a bolt or a screw is penetrated or screwed to fasten main body 132 and lid 134 so as to secure water-tightness and airtightness. An elastic member such as an O-ring, a gasket or an adhesive may intervene at the joint face between main body 132 and lid 134 to further improve water-tightness and airtightness.

At least one of the inner face and the outer face of main body 132 and lid 134 is subjected to surface treatment to facilitate absorption of heat radiated from the heater element HE and heat dissipation from housing 130.

As illustrated in FIG. 15, in order to facilitate the absorption of heat radiated from the heater element HE, the inner face of main body 132 is formed with a protruding portion 132B extending toward the heater element HE of circuit board 120 so as to be close to the heater element HE. Note here that if the protruding portion 132B is in contact with the heater element HE, stress will act on circuit board 120 due to vibration or the like, and therefore clearance is to be secured so as to prevent protruding portion 132B from being in contact with the heater element HE with consideration given to the dimensions of housing 130 or the like. Heat-conductive grease or the like may intervene between the heater element HE and protruding portion 132B.

Figure 16:
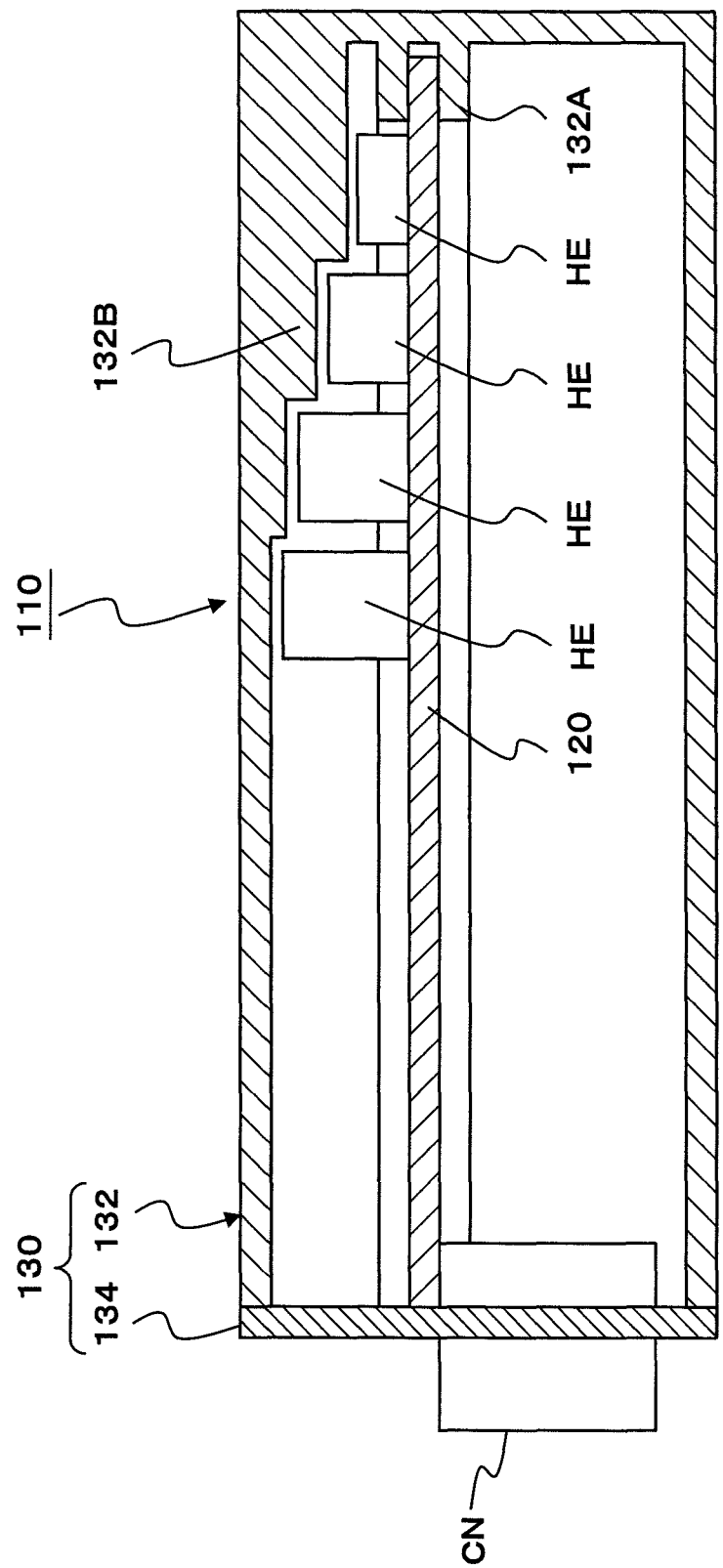
FIG. 16 is a cross-sectional view illustrating a first modification example of a protruding portion.

In the case in which a plurality of heater elements HE with different heights are mounted on circuit board 120, as illustrated in FIG. 16, a protruding portion 132B in a stepwise shape may be formed so as to gradually increase the height from the opening of main body 132 to the deepest part. This allows a die to be removed from the deepest part to the opening of main body 132 without the necessity of a complicated die configuration.

According to such an electronic controller 110, lid 134 with which circuit board 120 and the connector CN are integrated is fastened in a slidable manner with respect to substantially box-shape main body 132 opening at one face only, and therefore water-tightness and airtightness can be secured. Heat generated at the heater element HE of circuit board 120 is transmitted to main body 132 via protruding portion 132B. At this time, the protruding portion 132B is close to the heater element HE, thus facilitating the absorption of heat radiated from the heater element HE, so that heat generated at the heater element HE can be effectively transmitted to main body 132. Heat transmitted to main body 132 is then dissipated to the air from the outer face of main body 132, while being dissipated to the air from the outer face of lid 134. Herein, the surface treatment conducted to the inner face of main body 132 including protruding portion 132B can facilitate the absorption of heat generated at the heater element HE. Whereas, the surface treatment conducted to the outer faces of main body 132 and lid 134 can enhance the heat-dissipation effect from the outer faces to the air. Thus, the heat-dissipating property of electronic controller 110 can be improved.

That is, although it is conventionally difficult to make an electronic controller with a slide configuration because of a heat-dissipation problem, controller 110 in the second embodiment, can use a slide configuration because heat-dissipation property thereof can be improved. Thus, an electronic controller with excellent water-tightness and airtightness can be made in a simple configuration.

Figure 17:
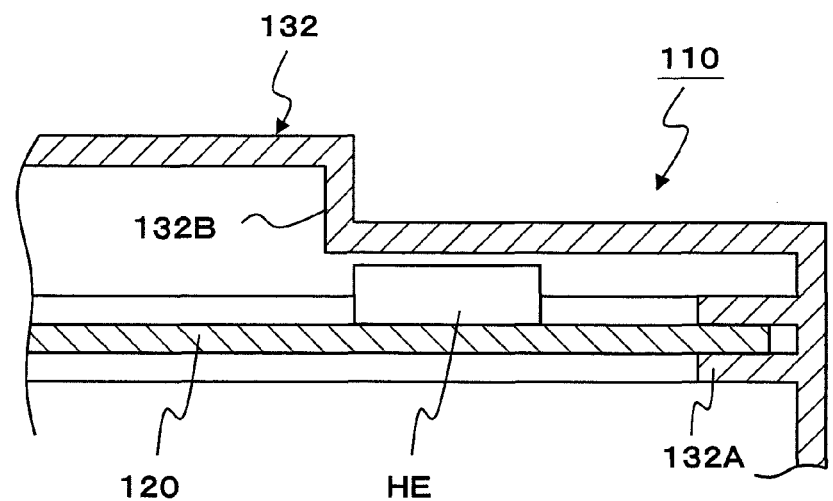
FIG. 17 is a partial cross-sectional view illustrating a first modification example of a main body.
Figure 18:
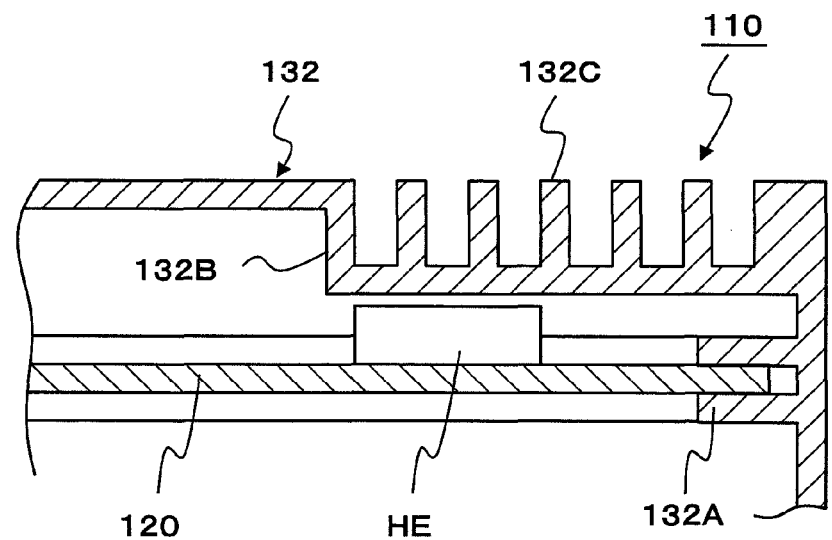
FIG. 18 is a partial cross-sectional view illustrating a second modification example of a main body.

As illustrated in FIG. 17, the outer face of main body 132 opposed to the heater element HE of the circuit board 120 may be recessed according to the inner face shape of protruding portion 132B. This can decrease the volume of main body 132, so that main body 132 can be miniaturized, and cost reduction and weight reduction can be expected. At the portion in which the outer face of main body 132 is recessed as described above, concavities and convexities may be formed to increase the heat-dissipation area, or a heat-dissipating fin 132C may be disposed in a line as illustrated in FIG. 18.

Meanwhile, from an aspect of heat transfer, minimum clearance between protruding portion 132B and the heater element HE is the most advantageous as long as protruding portion 132B is not in contact with the heater element HE or the vicinity thereof. Accordingly, as illustrated in FIG. 15, the heater element HE is disposed at a portion with high stiffness of circuit board 120, more specifically, in the vicinity of supporter 132A or in the vicinity of the joint part between main body 132 and lid 134, whereby deformation of circuit board 120 due to vibration or the like can be suppressed. Then, protruding portion 132B formed on the inner face of main body 132 opposed to the heater element HE allows the protruding portion 132B to be located at a portion with high stiffness of main body 132, whereby deformation of circuit board 120 and protruding portion 132B due to vibration or the like can be lessened. Thus, contact between the heater element HE and the protruding portion 132B can be suppressed even with small clearance.

Figure 19:
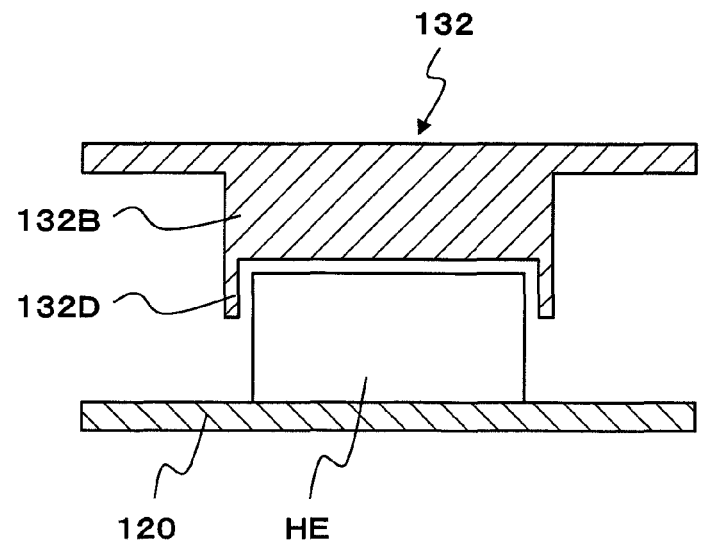
FIG. 19 is a partial cross-sectional view illustrating a second modification example of a protruding portion.

For preferable heat transfer from the heater element HE to protruding portion 132B, as illustrated in FIG. 19, an extending portion 132D extending toward the heater element HE may be integral with the protruding portion 132B so as to cover side walls of the heater element HE. This can further facilitate heat transfer to housing 130 because heat generated at the heater element HE is transmitted to extending portion 132D as well. In this case, since circuit board 120 with the heater element HE mounted thereon is accommodated in main body 132 in a slide manner, the extending portion 132D may cover at least a part of the side walls other than a part located on the opening side. For instance, when the heater element HE has a substantially rectangular parallelepiped shape, extending portion 132D may cover at least one of the three side walls other than the side wall on the opening side of the four side walls.

Figure 20:
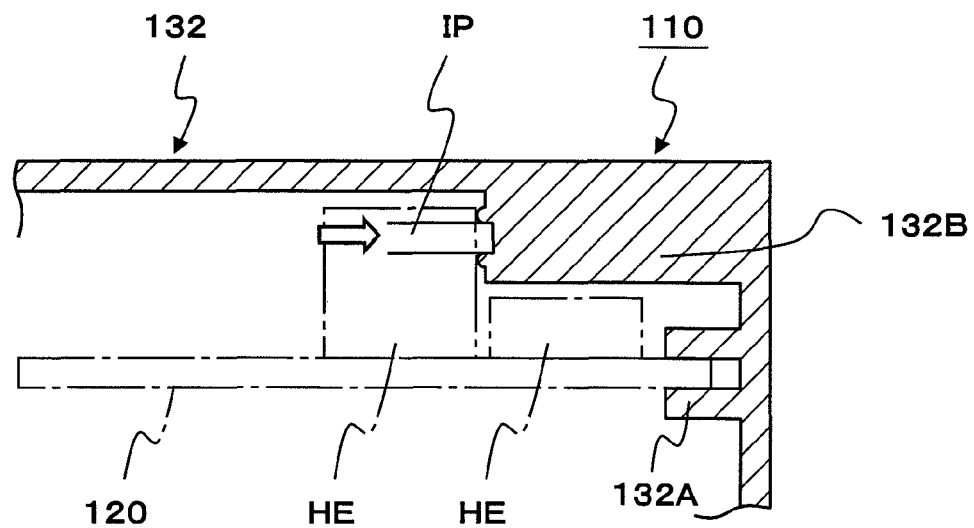
FIG. 20 is an explanatory view illustrating a problem when pressed by an eject pin.

In the case in which main body 132 is manufactured by casting using a die, the side wall (the face parallel to the opening) of the protruding portion 132B on the inner face opposed to the heater element HE of circuit board 120 can be effectively pressed by an eject pin to release main body 132 from a die for molding of the inner face shape of main body 132. In this case, when two heater elements HE with different heights are close to each other, as illustrated in FIG. 20, the periphery of a portion of protruding portion 132B pressed by the eject pin IP will rise toward the opening side, so as to come into contact with one of the heater element HE. Even when the rising portion at protruding portion 132B does not come into contact with the heater element HE, if circuit board 120 or housing 130 is deformed due to vibration or the like, the deformed part may come into contact with the heater element HE, thus resulting in stress acting thereon.

Figure 21:
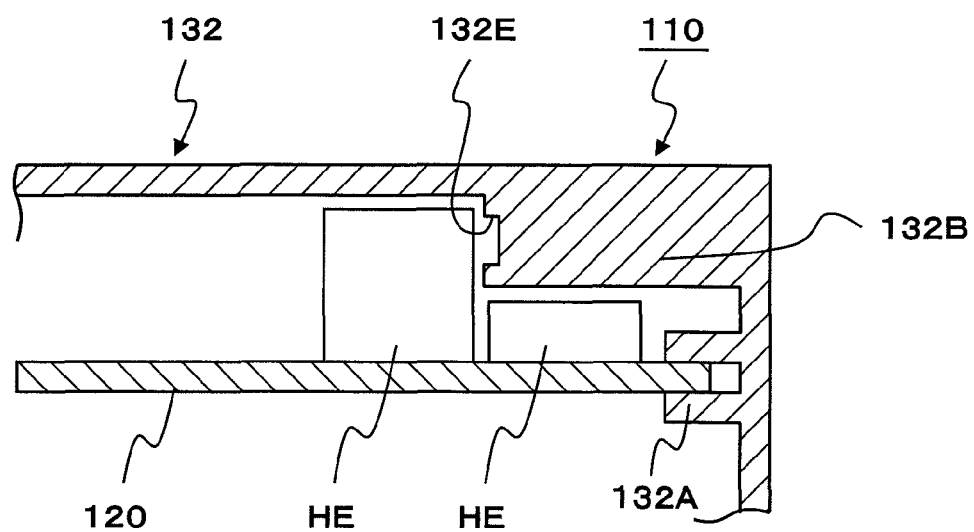
FIG. 21 is a partial cross-sectional view illustrating a third modification example of a protruding portion.

Therefore, when using a die making an eject pin IP press the side wall of protruding portion 132B, as illustrated in FIG. 21, a recessed portion 132E is preferably formed on the side wall of protruding portion 132B so as to accommodate the impression by the eject pin IP therein. The depth of recessed portion 132E may be greater than the height of the portion of protruding portion 132B rising due to contact with the eject pin IP, and the diameter of recessed portion 132E may be slightly greater than the diameter of the eject pin IP. Herein, recessed portion 132E may be formed in the side wall of protruding portion 132B only around the portion coming contact with the eject pin IP, whereby decrease in heat capacity can be suppressed.

Protruding portion 132B may be formed not only at the portion opposed to the heater element HE but also at the heater element HE, a pattern on the board, solder, and a portion including the periphery thereof, by which the temperature of circuit board 120 effectively can be decreased. The outer face of main body 132 opposite protruding portion 132B may be formed in a flat shape, a recess shape, a fin shape, a shape with fins disposed in a line in a recessed portion so as to let heat transmitted to housing 130 dissipated to the air. At this time, a fin shape or a shape with fins disposed in a line in a recessed portion on the outer face of housing 130 can increase the surface area for heat dissipation.

In second embodiment, main body 132 and lid 134 are made of alloys. However, only a heat-dissipation portion including protruding portion 132B opposed to the heater element HE may be made of metal, which may be molded into a housing made of resin or combined therewith.

The entire contents of Japanese Patent Applications No. 2010-060075 filed on Mar. 17, 2010, and No. 2010-063769 filed on Mar. 19, 2010, and No. 2010-065508 filed on Mar. 23, 2010, on which priority is claimed, are incorporated herein by reference.

While only a select embodiment has been chosen to illustrate and describe the present invention, it will be apparent to those skilled in the art from this disclosure that various changes and modifications can be made herein without departing from the scope of the invention as defined in the appended claims.

Furthermore, the foregoing description of the embodiment according to the present invention is provided for illustration only, and it is not for the purpose of limiting the invention, the invention as claimed in the appended claims and their equivalents.

What is claimed is:

1. An electronic controller for a vehicle, comprising:
   a circuit board on which an electronic component is mounted; and
   a housing made of metal which accommodates the circuit board therein, the housing including at least one of an inner face and an outer face having an applied or electrodeposited alumite surface treatment thereon, facilitating heat absorption and dissipation, and the inner face including a protruding portion extending to a heat-generating portion of the circuit board so as to be close to the heat-generating portion;
   wherein:
   the housing includes: a main body including a recessed portion to accommodate the circuit board; and a lid to close an opening of the main body;
   the heat-generating portion is a heat-generating element mounted on the circuit board; and
   the protruding portion is integral with an extending portion extending toward the heat-generating element so as to cover at least a part of a side wall of the heat-generating element.

2. The electronic controller for a vehicle, according to claim 1, wherein the heat-generating portion is a semiconductor chip, a pattern on the circuit board, solder, or a portion including a periphery thereof.

3. The electronic controller for a vehicle, according to claim 1, wherein the outer face of the housing opposite the protruding portion has a flat shape, a recess shape, a fin shape, or a shape with fins disposed in a line in a recessed portion.

4. The electronic controller for a vehicle, according to claim 1, wherein the protruding portion is disposed in a vicinity of a joint part of the main body and the lid or in a vicinity of a boss fastening the circuit board to the main body.

5. The electronic controller for a vehicle, according to claim 1, wherein the protruding portion includes a recessed portion representing a deformation area to accommodate deformation caused by a die-releasing eject pin during manufacture of the housing by casting.

6. The electronic controller for a vehicle, according to claim 1, wherein the protruding portion is disposed at a position on a line segment between two bosses among a plurality of bosses that fasten the circuit board to the main body.

7. The electronic controller for a vehicle, according to claim 1, wherein the protruding portion includes a lateral portion disposed beyond a range opposed to the heat-generating portion, the lateral portion representing a deformation area to accommodate deformation caused by a die-releasing eject pin during manufacture of the housing by casting.

8. An electronic controller for a vehicle, comprising:
   a circuit board on which an electronic component is mounted; and
   a housing made of metal which accommodates the circuit board therein, the housing including at least one of an inner face and an outer face having a surface treatment facilitating heat absorption and dissipation, and the inner face including a protruding portion extending to a heat-generating portion of the circuit board so as to be close to the heat-generating portion;
   wherein the housing includes: a main body in the form of a box shape having an opening at one face; and a lid that closes the opening of the main body, the lid being integrated with the circuit board and being slidable relative to the main body of the housing to close the opening.

9. The electronic controller for a vehicle, according to claim 8, wherein the protruding portion is disposed in a vicinity of a supporter slidably supporting the circuit board or in a vicinity of a joint part between the main body and the lid.

10. The electronic controller for a vehicle, according to claim 8,
wherein the heat-generating portion is a heat-generating element mounted on the circuit board, and
the protruding portion is integral with an extending portion extending toward the heat-generating element so as to cover: at least a part of a side wall of the heat-generating element other than a side wall of the heat-generating element, which faces the opening to insert the circuit board to the housing.

11. The electronic controller for a vehicle, according to claim 8, wherein a side wall of the protruding portion includes a recessed portion representing a deformation area to accommodate deformation caused by a die-releasing eject pin during manufacture of the housing by casting.

12. An electronic controller for a vehicle, comprising:
a circuit board on which an electronic component is mounted; and
a housing made of metal which accommodates the circuit board therein, the housing including at least one of an inner face and an outer face having an applied or electro-deposited alumite surface treatment thereon, facilitating heat absorption and dissipation, and the inner face including a plurality of concavities and convexities in at least a part thereof opposed to a surface of the electronic component so as to increase a surface area of the inner face, which opposes the surface of the electronic component;
wherein the plurality of concavities and convexities are shaped so as to improve at least one of melt flow during casting of the housing and stiffness of the housing.

13. The electronic controller for a vehicle, according to claim 12, wherein the outer face of the housing further comprises outer concavities and convexities in an area corresponding to the concavities and convexities on the inner face, so as to increase a surface area of the outer face.

14. The electronic controller for a vehicle, according to claim 13, wherein the outer concavities and convexities on the outer face of the housing are shaped corresponding to the concavities and convexities on the inner face.

15. The electronic controller for a vehicle, according to claim 14, wherein the outer concavities and convexities on the outer face of the housing: are of a same phase according to the concavities and convexities on the inner face of the housing, are symmetric about a line with reference to the concavities and convexities on the inner face of the housing, or intersect at a predetermined angle with the concavities and convexities on the inner face of the housing.

16. The electronic controller for a vehicle, according to claim 12, wherein the concavities and convexities are in a fin shape, a sine-wave shape, a rectangular-wave shape, a saw-tooth-wave shape, a triangular-wave shape, a protruding portion shape including a cone shape, or a pearskin finish shape.

17. The electronic controller for a vehicle, according to claim 12, wherein the housing includes a flat part to separate a first plurality of the concavities and convexities from a second plurality of the concavities and convexities.

* * * * *